(12) United States Patent
Woo et al.

(10) Patent No.: US 11,631,444 B2
(45) Date of Patent: Apr. 18, 2023

(54) HIGH BANDWIDTH MEMORY SYSTEM USING MULTILEVEL SIGNALING

(71) Applicant: SAMSUNG ELECTRONICS CO., LTD., Suwon-si (KR)

(72) Inventors: Byungsuk Woo, Hwaseong-si (KR); Changkyu Seol, Osan-si (KR); Cheolmin Park, Suwon-si (KR); Sucheol Lee, Suwon-si (KR); Chanik Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 17/483,010

(22) Filed: Sep. 23, 2021

(65) Prior Publication Data
US 2022/0238146 A1    Jul. 28, 2022

(30) Foreign Application Priority Data
Jan. 26, 2021 (KR) .................. 10-2021-0010520

(51) Int. Cl.
*G11C 7/22*  (2006.01)
*H01L 25/065*  (2023.01)
(Continued)

(52) U.S. Cl.
CPC .................. *G11C 7/22* (2013.01); *G11C 7/16* (2013.01); *H01L 25/0657* (2013.01); *H01L 27/10897* (2013.01)

(58) Field of Classification Search
CPC .. G11C 7/22; G11C 7/16; G11C 5/063; G11C 7/02; G11C 7/1006; G11C 5/04; H01L 25/0657; H01L 27/10897; H01L 2225/06513; H01L 2225/06517; H01L 2225/06541; H01L 25/18; H01L 25/10
(Continued)

(56) References Cited

U.S. PATENT DOCUMENTS 9,231,585 B2    1/2016  Hsu et al.
9,621,337 B2    4/2017  Hao et al.
(Continued)

FOREIGN PATENT DOCUMENTS

CN    110324066 A  *  10/2019
JP    2005038770 A  *   2/2005

*Primary Examiner* — Fernando Hidalgo
(74) *Attorney, Agent, or Firm* — F. Chau & Associates, LLC (57) ABSTRACT

A high bandwidth memory system includes a motherboard; and a semiconductor package coupled to the motherboard. The semiconductor package includes a package substrate mounted on the motherboard and including signal lines providing a plurality of channels; a first semiconductor device mounted on the package substrate and including a first physical layer (PHY) circuit; and a second semiconductor device mounted on the package substrate and including a second PHY circuit. The first semiconductor device and the second semiconductor device exchange a data signal with each other through the plurality of channels, the data signal is a multilevel signal having M levels, where M is a natural number greater than 2, and the first PHY circuit compensates for distortion of the channels and performs digital signal processing to compensate for a mismatch between the channels.

20 Claims, 10 Drawing Sheets

(51) Int. Cl.
  *G11C 7/16*   (2006.01)
  *H01L 27/108* (2006.01)
(58) Field of Classification Search
  USPC .......................................................... 365/244
  See application file for complete search history.

(56) References Cited

U.S. PATENT DOCUMENTS

| | | |
|---|---|---|
| 10,128,964 B2 | 11/2018 | Wiley |
| 10,425,260 B2 | 9/2019 | Hollis et al. |
| 2019/0102330 A1 | 4/2019 | Hasbun et al. |
| 2019/0179769 A1 | 6/2019 | Keeth et al. |
| 2020/0145261 A1 | 5/2020 | Navid |
| 2020/0243422 A1* | 7/2020 | Kim .................. H01L 23/49816 |
| 2020/0371566 A1* | 11/2020 | Steely, Jr. ............ H01L 23/5385 |
| 2020/0381393 A1* | 12/2020 | Lee ...................... H01L 23/5385 |
| 2021/0098421 A1* | 4/2021 | Wu ........................ H01L 24/16 |
| 2021/0183812 A1* | 6/2021 | Ghosh ..................... H01L 25/50 |
| 2021/0366873 A1* | 11/2021 | Gandhi ............... H01L 25/0657 |
| 2022/0189907 A1* | 6/2022 | Nam ................... H01L 23/3135 |

* cited by examiner

HIGH BANDWIDTH MEMORY SYSTEM USING MULTILEVEL SIGNALING

CROSS-REFERENCE TO RELATED APPLICATION(S)

This application claims priority under 35 U.S.C. § 119(a) to Korean Patent Application No. 10-2021-0010520, filed on Jan. 26, 2021 in the Korean Intellectual Property Office, the disclosure of which is incorporated by reference herein in its entirety.

TECHNICAL FIELD

Example embodiments of the present inventive concept relate to a high-bandwidth memory system using multilevel signaling.

DISCUSSION OF RELATED ART

A high bandwidth memory (HBM) includes a buffer die and a plurality of memory dies stacked on the buffer die. The buffer die and the plurality of memory dies are electrically connected to each other through through-silicon vias (TSV) and microbumps.

A logic chip such as a graphics processing unit (GPU) and the HBM may be integrated on a silicon interposer and implemented as a single package. Accordingly, the distance between the logic chip and the HBM may be significantly reduced, and transmission speed may be increased.

The interposer refers to a microcircuit board additionally inserted between a semiconductor chip and a package substrate when the gap between input/output pads of the semiconductor chip manufactured by microprocessing and the gap between input/output pads of the package substrate such as a PCB do not match each other. The interposer has a multilayer wiring structure to redistribute inputs and outputs of the semiconductor chip.

In a multilevel signal, each voltage level represents one or more data bits. Although the data rate of the multilevel signal increases compared to the binary signal, since the voltage level interval is narrow, the signal may be distorted or lost.

SUMMARY

Example embodiments provide a high-bandwidth memory system, in which a digital signal processing function is mounted on a buffer die and which communicates using multilevel signaling without an interposer.

According to example embodiments, a high bandwidth memory system includes a motherboard; and a semiconductor package coupled to the motherboard. The semiconductor package includes a package substrate mounted on the motherboard and including signal lines providing a plurality of channels; a first semiconductor device mounted on the package substrate and including a first physical layer (PHY) circuit; and a second semiconductor device mounted on the package substrate and including a second PHY circuit. The first semiconductor device and the second semiconductor device exchange a data signal with each other through the plurality of channels, the data signal is a multilevel signal having M levels, where M is a natural number greater than 2, and the first PHY circuit compensates for distortion of the channels and performs digital signal processing to compensate for a mismatch between the channels.

According to example embodiments, a high bandwidth memory system includes a package substrate including signal lines providing a plurality of channels; at least one first semiconductor device including a buffer die and memory dies stacked on the buffer die; a second semiconductor device exchanging a data signal with the first semiconductor device through the plurality of channels; and connection terminals directly connecting the at least one first semiconductor device and the second semiconductor device to the package substrate. The data signal is a multilevel signal having M levels, where M is a natural number greater than 2, and the at least one first semiconductor device compensates for distortion of the channels and compensates for a mismatch between the channels.

According to example embodiments, a high bandwidth memory system includes a buffer die including a transmission circuit and a receiving circuit exchanging a data signal with a processor through channels of a package substrate; and a plurality of memory dies stacked on the buffer die and connected to the buffer die through a plurality of through-electrodes. The receiving circuit of the buffer die includes analog-to-digital converters (ADCs) corresponding to the channels and converting a multilevel signal having M levels, where M is a natural number greater than 2, received through the channels, into a digital signal; a first compensation circuit compensating for distortion of the channels and compensating for a mismatch between the channels; a decoder converting the digital signal into a binary signal; and a driver outputting the binary signal to the plurality of through-electrodes.

BRIEF DESCRIPTION OF THE DRAWINGS

The above and other features of the present inventive concept will become more apparent by describing in detail example embodiments thereof with reference to the accompanying drawings, in which.

DETAILED DESCRIPTION

Example embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms.

Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

In this specification, the term "channel" refers to an input/output path for exchanging data between a first semiconductor device and a second semiconductor device, and the channel may be provided by a wiring layer of a semiconductor device and a signal line of a substrate.

Figure 1:
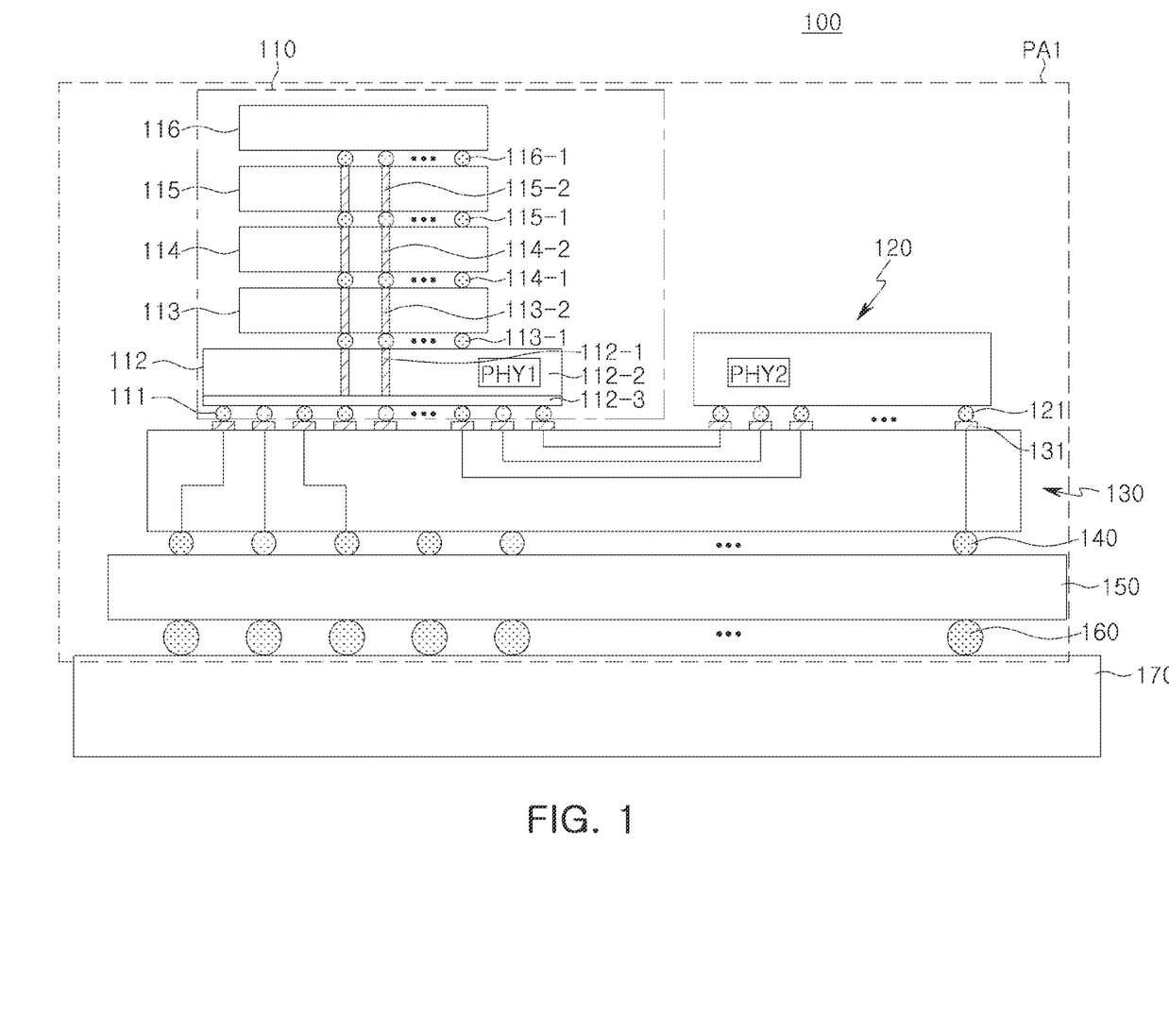
FIG. 1 is a cross-sectional view of a high-bandwidth memory system according to a comparative example.

FIG. 1 is a cross-sectional view of a high-bandwidth memory system according to a comparative example.

Referring to FIG. 1, a high-bandwidth memory system 100 may include a first semiconductor device 110, a second semiconductor device 120, an interposer 130, a package substrate 150, and a motherboard 170.

The first semiconductor device 110 may be a memory package. For example, the first semiconductor device 110 may be a high bandwidth memory (HBM). The second semiconductor device 120 may be a processor (or host) such as, for example, a central processing unit (CPU), a graphics processing unit (GPU), a system-on-chip (SoC), an Application-Specific Integrated Circuit (ASIC), or the like.

The first semiconductor device 110 may include a plurality of microbumps 111, a buffer die 112, and first to fourth memory dies 113, 114, 115 and 116. The buffer die 112 may be disposed in a lowermost portion of the first semiconductor device 110. The buffer die 112 may be referred to as, for example, a logic die, a base die, or the like.

The first to fourth memory dies 113-116 may be sequentially stacked on the buffer die 112. The buffer die 112 and the first to fourth memory dies 113-116 may be interconnected through through-silicon vias (TSVs) 112-1, 113-2, 114-2, and 115-2. Each of the first to fourth memory dies 113-116 may include banks, and each bank may include a memory cell array including memory cells positioned at intersections of word lines and bit lines. For example, the memory cell may be a dynamic random access memory (DRAM) cell, or the like.

Several logic functions may be implemented in the buffer die 112. The buffer die 112 may include a circuit region 112-2 and a wiring layer 112-3. The circuit region 112-2 may be a region including a wafer and circuits provided by elements formed on the wafer. Some of the circuits may constitute a first physical layer circuit PHY1. When the first physical layer circuit PHY1 is a transmission circuit, the first physical layer circuit PHY1 may be configured as a driver, and when the first physical layer circuit PHY1 is a receiving circuit, the first physical layer circuit PHY1 may be configured as a buffer. The circuit region 112-2 may be formed of silicon or the like.

The plurality of TSVs 112-1 may penetrate through the buffer die 112. The first memory die 113 is stacked on the buffer die 112, and the buffer die 112 may be electrically connected to the first memory die 113 through the plurality of TSVs 112-1. A plurality of first micro-bumps 113-1 may be disposed between the buffer die 112 and the first memory die 113. Each of the plurality of first microbumps 113-1 may include, for example, nickel (Ni), copper (Cu), tin (Sn), lead (Pb), or the like. Each of the plurality of first microbumps 113-1 may be formed in a hemispherical or convex shape. Each of the plurality of first microbumps 113-1 may have a size of several micrometers or several tens of micrometers.

In the manner described above, the buffer die 112 and the plurality of memory dies 113-116 may be electrically connected to each other through the microbumps 113-1, 114-1, 115-1 and 116-1, TSVs 112-1, 113-2, 114-2 and 115-2, and an internal wiring circuit.

The first semiconductor device 110 may be stacked on the interposer 130. For example, through the combination of the microbumps 111 of the first semiconductor device 110 and upper pads 131 of the interposer 130, the first semiconductor device 110 may be stacked on the interposer 130. For example, the first semiconductor device 110 may be electrically connected to the interposer 130.

The first semiconductor device 110 may be stacked on the package substrate 150 via the interposer 130. The interposer 130 may electrically connect the first semiconductor device 110 to the package substrate 150. The package substrate 150 may be a substrate for a package, for example, a printed circuit board (PCB) having a circuit pattern, but is not limited thereto.

The second semiconductor device 120 may be stacked on the interposer 130. For example, through the combination of microbumps 121 of the second semiconductor device 120 and the upper pads 131 of the interposer 130, the second semiconductor device 120 may be stacked on the interposer 130. The second semiconductor device 120 may be stacked on the package substrate 150 via the interposer 130. The interposer 130 may electrically connect the second semiconductor device 120 to the package substrate 150. The second semiconductor device 120 may include a second physical layer circuit PHY2.

The interposer 130 may include the upper pads 131, an upper wiring layer, a substrate, a lower wiring layer, through-electrodes, and connection terminals 140. The substrate may be formed of any one of, for example, silicon, organic, plastic, and glass substrates. The substrate may have a single layer or a multilayer structure. The interposer 130 may also be referred to as a silicon interposer when the substrate is a silicon substrate. However, interposer 130 is not limited thereto, and the interposer 130 may include at least one of, for example, silicon, glass, ceramic, or plastic.

The upper pads 131 may be disposed on the upper surface of the substrate, and the upper pads 131 may be electrically coupled to the microbumps of the semiconductor device. The connection terminals 140 may be disposed on the lower surface of the substrate. The connection terminals 140 may be used when stacking the interposer 130 on a printed circuit board (PCB) or the like. The connection terminals 140 may be bumps or solder balls based on the shape or a material thereof. The upper wiring layer may be disposed below the upper pads 131 to be electrically connected to the upper pads 131, and the lower wiring layer may be connected to the upper wiring layer through through-electrodes penetrating through at least a portion of the substrate. The connection terminals 140 may be electrically connected to the through-electrodes.

The first semiconductor device 110, the second semiconductor device 120, the interposer 130, and the package substrate 150 may be provided as one semiconductor package PA1, and the semiconductor package PA1 may be implemented by one of techniques such as, for example, a system-in-package (SIP) a multi-chip package (MCP), and the like.

The semiconductor package PA1 may be mounted on the motherboard 170 through an external connection terminal 160 of the package substrate 150. The external connection terminal 160 may be a bump or a solder ball. The semiconductor package PA1 may be mounted on the motherboard 170 through the external connection terminal 160 in a ball grid array (BGA) method, but the mounting method is not limited thereto.

The size of the external connection terminal 160 may be larger than the size of the connection terminal 140, and the size of the connection terminals 140 may be larger than the size of the microbumps 111 and 121, but are not limited thereto.

The interposer 130 refers to a microcircuit board that is additionally inserted between a semiconductor chip and a package substrate, when the gap between input and output pads of the semiconductor chip manufactured by microprocessing, and the gap between input and output pads of the package substrate 150 such as a PCB, do not match each other. A silicon interposer may be implemented as the interposer 130. Utilization of a silicon interposer as the interposer 130 may greatly increase the manufacturing cost of high-bandwidth memory systems.

In a high-bandwidth memory system according to an example embodiment of the present inventive concept, semiconductor devices may communicate with each other using a plurality of channels provided by signal lines included in a package substrate without an interposer. That is, according to example embodiments, an interposer such as, for example, the interposer 130, is not included in a high-bandwidth memory system. Therefore, there may be an effect of lowering the manufacturing unit cost of the high-bandwidth memory system according to example embodiments. High-bandwidth memory systems may use multilevel signaling. Deteriorated signal integrity (SI) environments and mismatches between different channels, which may occur when communicating using signal lines included in the package substrate, may be overcome using digital signal processing functions.

Figure 2:
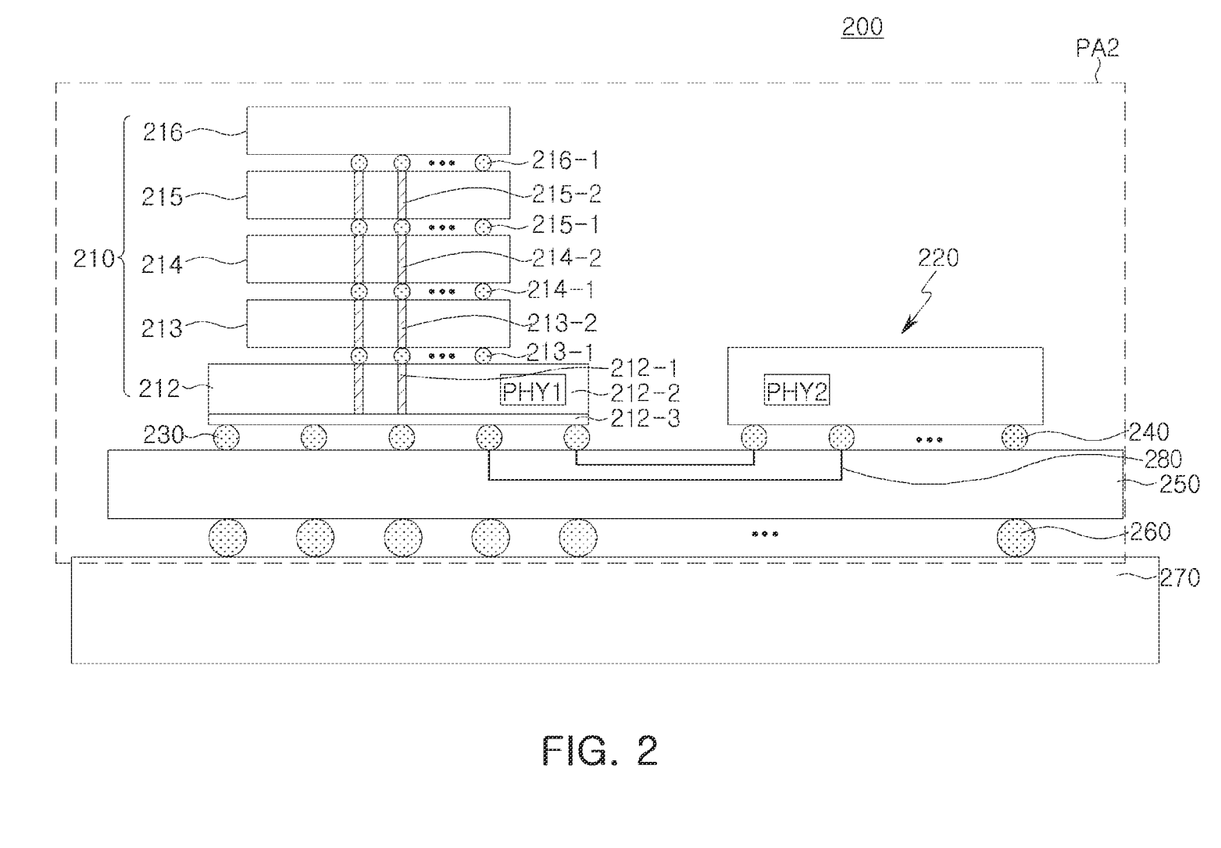
FIG. 2 is a cross-sectional view of a high-bandwidth memory system according to an example embodiment of the present inventive concept.

FIG. 2 is a cross-sectional view of a high-bandwidth memory system according to an example embodiment of the present inventive concept.

Focusing on the difference from FIG. 1, unlike the high-bandwidth memory system 100 of FIG. 1, in an example embodiment, a high-bandwidth memory system 200 of FIG. 2 does not include an interposer between semiconductor devices 210 and 220 and a package substrate 250. The semiconductor devices 210 and 220 may be stacked on the package substrate 250 using connection terminals 230 and 240 such as, for example, a general bump, a solder ball, or the like.

A first semiconductor device 210, a second semiconductor device 220, and the package substrate 250 may be provided as a single semiconductor package PA2, and the semiconductor package PA2 may be implemented by one of techniques such as, for example, a system in package (SIP) and a multi-chip package (MCP).

The first semiconductor device 210 may include a buffer die 212 and first to fourth memory dies 213, 214, 215 and 216 sequentially stacked on the buffer die 212. The buffer die 212 may include a circuit region 212-2 and a wiring layer 212-3. The buffer die 212 and the first to fourth memory dies 213-216 may be electrically connected to each other through microbumps 213-1, 214-1, 215-1 and 216-1, TSVs 212-1, 213-2, 214-2, and 215-2, and an internal wiring circuit.

The semiconductor package PA2 may be mounted on a motherboard 270 through external connection terminals 260. The external connection terminals 260 may be bumps or solder balls. The semiconductor package PA2 may be mounted on the motherboard 270 through the external connection terminals 260 in a ball grid array (BGA) method, but the mounting method is not limited thereto.

The package substrate 250 may include signal lines 280 providing a plurality of channels, and the first semiconductor device 210 and the second semiconductor device 220 may communicate with each other through channels provided by the signal lines of the package substrate 250.

First connection terminals 230 may directly connect the first semiconductor device 210 and the package substrate 250, and second connection terminals 240 may directly connect the second semiconductor device 220 and the package substrate 250. The first semiconductor device 210 may include a first physical layer circuit PHY1, and the second semiconductor device 220 may include a second physical layer circuit PHY2.

Referring back to FIG. 1, HBM corresponding to an example of the first semiconductor device 110 of FIG. 1 may have increased bandwidth by significantly increasing the number of channels, and the semiconductor devices 110 and 120 are connected to each other through the interposer 130 and the microbumps 111 and 121, thereby obtaining high density interconnection (HDI).

Referring again to FIG. 2, the semiconductor devices 210 and 220 may be connected to the package substrate 250 through the connection terminals 230 and 240. The connection terminals 230 and 240 may be general bumps or solder balls. The size of the connection terminals 230 and 240 of FIG. 2 may be larger than the size of the microbumps 111 and 121 of FIG. 1. Accordingly, the number of connection terminals 230 and 240 between the semiconductor devices 210 and 220 and the package substrate 250 may be less than the number of microbumps 111 and 121 between the semiconductor devices 110 and 120 and the interposer 130 of FIG. 1. Accordingly, the number of channels provided by the signal lines of the package substrate 250 of FIG. 2 may be less than the number of channels provided by the signal lines of the interposer 130 of FIG. 1.

In the high-bandwidth memory system 200 according to an example embodiment, data signals exchanged between the first semiconductor device 210 and the second semiconductor device 220 may be multilevel signals having M levels, where M is a natural number greater than 2. The multilevel signal may be generated based on, for example, pulse amplitude modulation (PAM) 4, PAM8, PAM16, or the like. For example, the data signal may be generated based on PAM4, and may be a multilevel signal having four different levels. In M-ary PAM, one symbol may represent $\log_2$M-bit. Therefore, when multilevel signaling is used, a data rate may be increased, as compared to a binary signal.

However, the multilevel signal has a narrower voltage level interval compared to the binary signal, and may communicate through channels provided by the signal lines of the package substrate 250 to cause the occurrence of inter-symbol interference (ISI). Therefore, the signal integrity (SI) environment may be poor. Also, a mismatch may occur between different channels.

The high-bandwidth memory system 200 according to an example embodiment of the present inventive concept may overcome an SI environment that has become poor and a mismatch between different channels by using a digital signal processing function.

Figure 3:
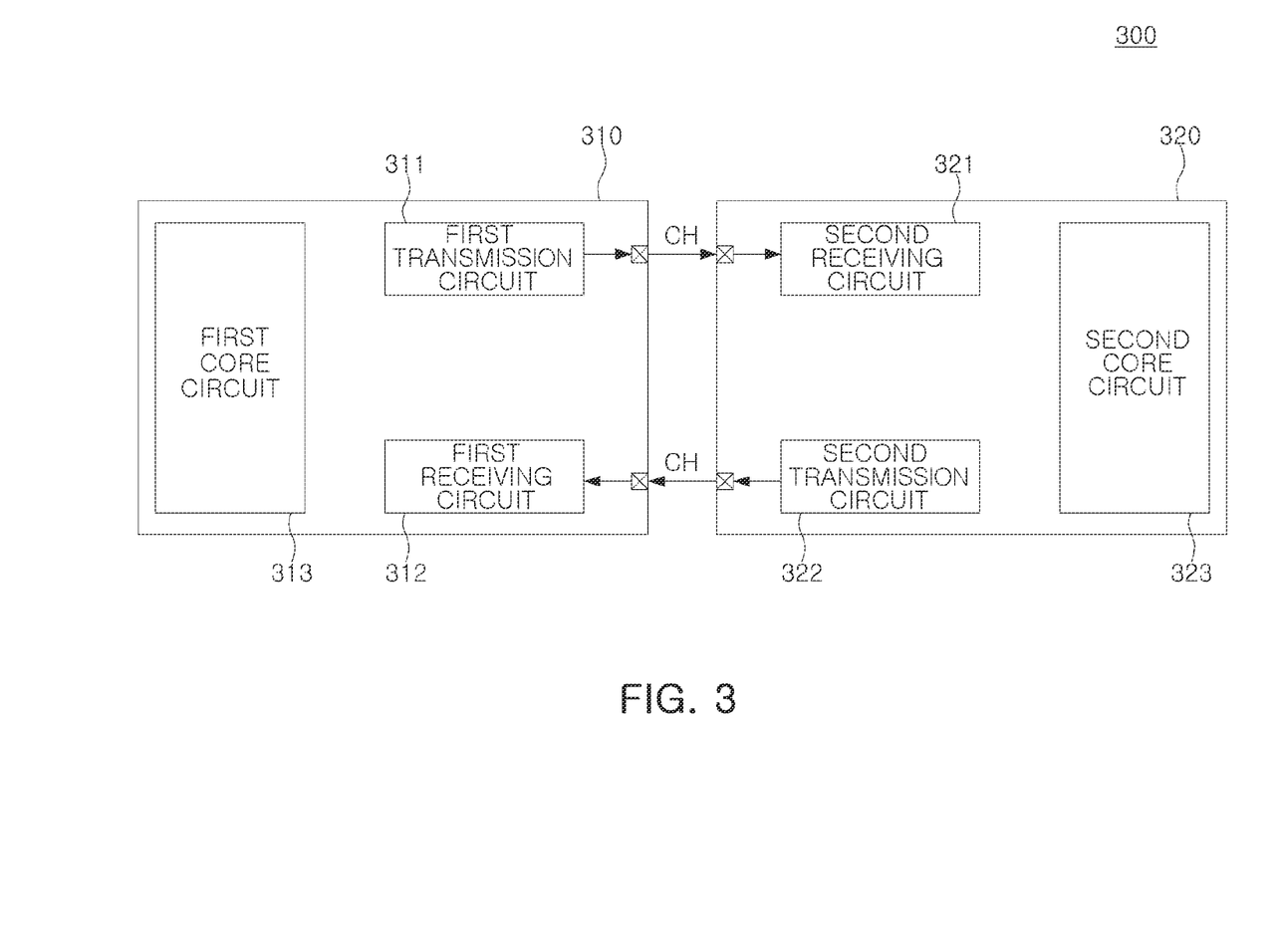
FIG. 3 is a schematic diagram of a memory system according to an example embodiment.

FIG. 3 is a schematic diagram of a memory system according to an example embodiment.

Referring to FIG. 3, a high-bandwidth memory system 300 according to an example embodiment may include a first semiconductor device 310 and a second semiconductor device 320. The first semiconductor device 310 may correspond to the first semiconductor device 210 of FIG. 2, and the second semiconductor device 320 may correspond to the second semiconductor device 220 of FIG. 2. The first semiconductor device 310 and the second semiconductor device 320 may exchange data through channels CH provided by signal lines of the package substrate.

The first semiconductor device 310 may include a first transmission circuit 311 that transmits data, a first receiving circuit 312 that receives data, and a first core circuit 313 that controls the overall operation of the first semiconductor device 310. The first transmission circuit 311 and the first receiving circuit 312 may be implemented in a physical layer circuit of a buffer die included in the first semiconductor device 310.

The second semiconductor device 320 may include a second receiving circuit 321 that receives data, a second transmission circuit 322 that transmits data, and a second core circuit 323 that controls the overall operation of the second semiconductor device 320.

In the high-bandwidth memory system 300, the first semiconductor device 310 and the second semiconductor device 320 may exchange data with each other, with a multilevel signal having M levels, in which M is a natural number greater than 2. For example, M may be a power of 2, and may be determined according to the amount of data to be transmitted through each of the channels CH.

The first receiving circuit 312 may receive and restore the multilevel signal transmitted from the second transmission circuit 322. For example, the first receiving circuit 312 may convert a multilevel signal having M levels into a digital signal and perform a digital signal processing function on the digital signal. The first receiving circuit 312 may convert the digital signal into a binary signal and transmit the converted binary signal to a plurality of memory dies.

The first transmission circuit 311 may convert data to be transmitted to the second receiving circuit 321 into a multilevel signal and may output the converted signal. For example, the first transmission circuit 311 may convert a binary signal into a multilevel signal having M levels, and perform a digital signal processing function on the multilevel signal. The first transmission circuit 311 may convert the multilevel signal into an analog signal and transmit the converted signal to channels of the package substrate.

The high-bandwidth memory system 300 according to an example embodiment may communicate using multilevel signaling without an interposer. Accordingly, the manufacturing costs of the high-bandwidth memory system 300 may be reduced.

The high-bandwidth memory system 300 according to an example embodiment may mount a digital signal processing function on a buffer die of the first semiconductor device 310. The high-bandwidth memory system 300 may compensate for distortion of channels CH and a mismatch between the channels CH, using the digital signal processing function.

Figure 4:
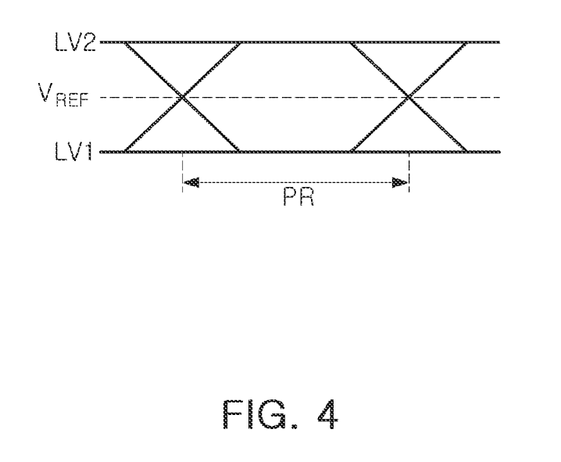
FIGS. 4 and 5 are diagrams illustrating a multilevel signal according to an example embodiment.
Figure 5:
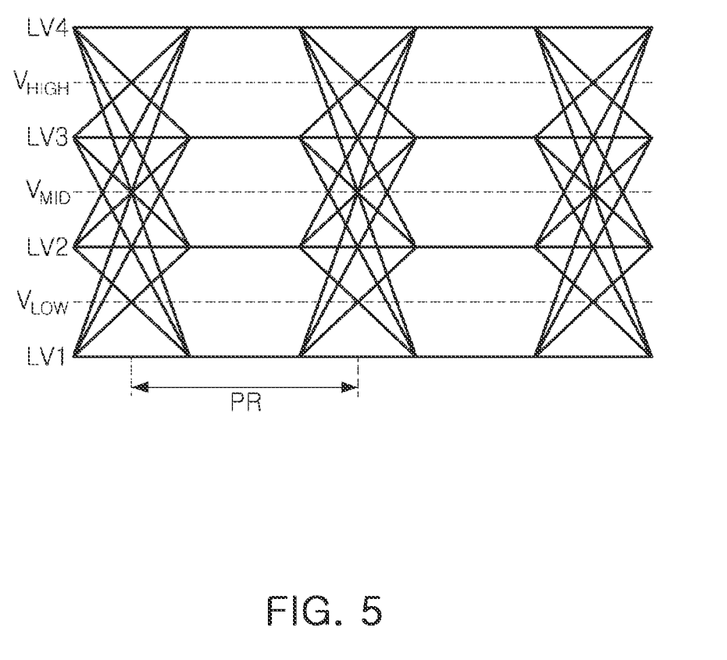

FIGS. 4 and 5 are diagrams illustrating a multilevel signal according to an example embodiment.

Referring to FIG. 4, a non-return zero (NRZ) signal may be a binary code using a low signal level (LV1) and a high signal level (LV2) to indicate "1" information and "0" information of a digital logic signal. When data is received with the NRZ signal, one bit of data may be received during one data transmission period PR. For example, each of two levels LV1 and LV2 may correspond to bits of data of 0 or 1. The NRZ signal may transmit one bit of data during one data transmission period. In FIG. 4, $V_{REF}$ indicates a reference level.

Referring to FIG. 5, a multilevel signal may have four levels LV1, LV2, LV3 and LV4. The multilevel signal may be generated based on 4-level pulse amplitude modulation-4 (PAM-4). When data is received with a multilevel signal generated based on 4-level pulse amplitude modulation, two bits of data may be received during one data transmission period PR. In FIG. 5, $V_{LOW}$ indicates a low level, $V_{MID}$ indicates a mid level, and $V_{HIGH}$ indicates a high level.

For example, when natural mapping is applied, the four levels LV1 to LV4 may sequentially correspond to bits of data of 00, 01, 10, and 11, respectively. Accordingly, the memory device may receive two bits, for example, one of bits of data of 00, 01, 10, and 11 during one data transmission period PR. As another example, when gray mapping is applied to significantly reduce a bit error rate, the four levels LV1-LV4 may sequentially correspond to bits of data of 00, 01, 11, and 10, respectively. In this specification, only an example of applying natural mapping or gray mapping when converting an NRZ signal into a multilevel signal is described. However, example embodiments of the present inventive concept are not limited thereto.

The multilevel signal of FIG. 5 has twice the amount of data that may be transmitted during one data transmission period than that of the NRZ signal of FIG. 4, but has a relatively narrow signal level interval. If the signal level interval is narrow, the signal may be lost due to distortion when the signal is transmitted through the channel.

The high-bandwidth memory system according to an example embodiment of the present inventive concept may include a digital signal processing function. Therefore, the distortion of the signal may be compensated.

Figure 6:
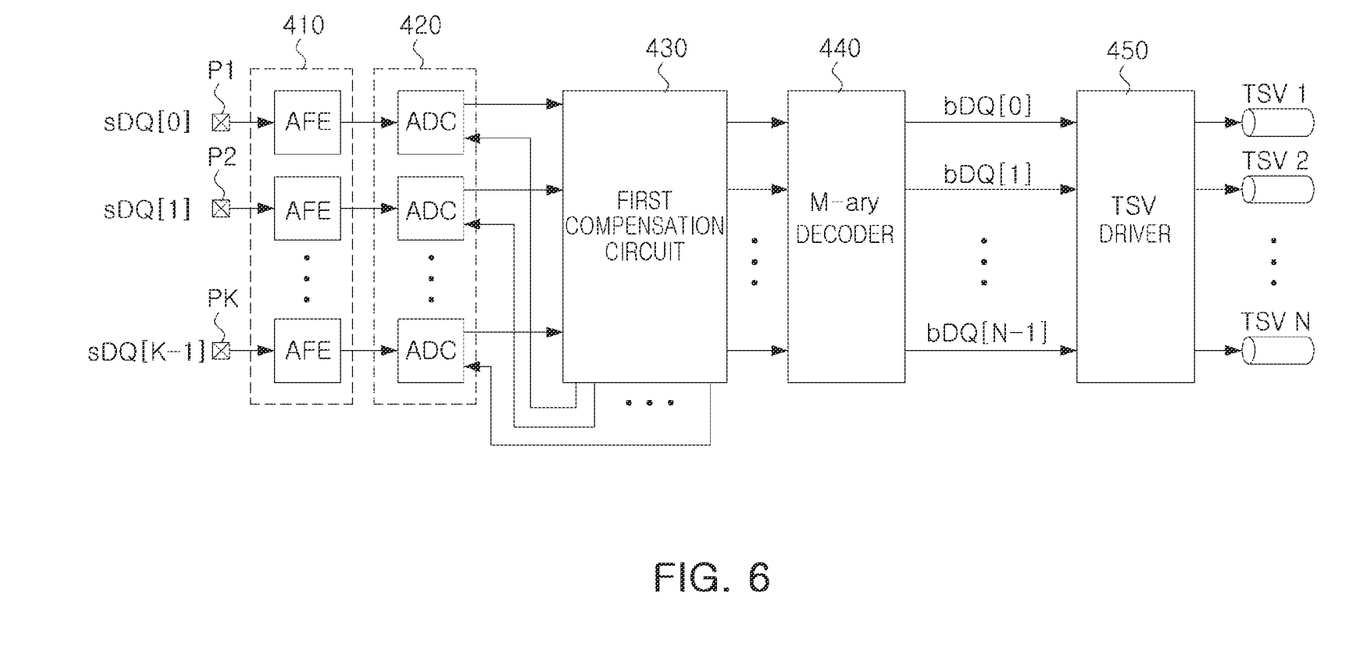
FIG. 6 illustrates a receiving circuit of a semiconductor device according to an example embodiment.

FIG. 6 illustrates a receiving circuit of a semiconductor device according to an example embodiment.

Referring to FIG. 6, a receiving circuit 400 may receive multilevel signals sDQ[0] to sDQ[K−1] having M levels through K data pins P1 to PK. The receiving circuit 400 converts the multilevel signals sDQ[0] to sDQ[K−1] to binary signals bDQ[0] to bDQ[N−1], and may output the binary signals bDQ[0] to bDQ[N−1] to TSVs (TSV1 to TSVN) through N TSV pins. K is a natural number less than N, and $N=K \cdot \log_2 M$ is satisfied.

The receiving circuit 400 may include an analog front end (AFE) 410, an analog-to-digital converter (ADC) 420, a first compensation circuit 430, a decoder 440, and a TSV driver 450. The components illustrated in FIG. 6 may be included in the first physical layer circuit PHY1 of the first semiconductor device 210.

The AFE 410 may include a plurality of AFEs corresponding to a plurality of channels. The AFE 410 may receive multilevel signals sDQ[0] to sDQ[K-1] having M levels through data pins P1 to Pk. The AFE 410 may amplify the attenuated analog signal input from externally, remove noise, and restore the signal to be close to the original signal.

The ADC 420 may include a plurality of ADCs corresponding to a plurality of channels. The ADC is a circuit that converts analog signals into digital signals. The ADC 420 may convert the analog signal into a digital signal through sampling, quantization, and encoding. The sampling may extract the value of an analog signal with a constant sampling period. By sampling the analog signal, a continuous analog signal may appear as a discrete time signal. The quantization may represent the level of the extracted sampling signal in several steps. In quantization, a sampled value may be classified for each section and replaced with a representative value of each section. The encoding may convert a value belonging to a level divided by quantization into a binary number. In encoding, a binary code may be allocated for each section and a sampled value may be converted into a binary code.

The first compensation circuit 430 may receive a digital signal output from the ADC 420 and perform digital signal processing. For example, the first compensation circuit 430 may compensate for distortion of channels and compensate for a mismatch between channels. For example, the first compensation circuit 430 may remove an ISI phenomenon of the data signal, and may compensate for the inter-channel timing skew mismatch, the inter-channel offset mismatch, the inter-channel gain mismatch, and sampling timing mismatch. The first compensation circuit 430 will be described in detail with reference to FIG. 7.

The decoder 440 may convert the digital signal on which digital signal processing has been performed, into binary signals bDQ[0] to bDQ[N-1].

The TSV driver 450 may allocate the binary signals bDQ[0] to bDQ[N-1] to the TSVs TSV1 to TSVn through TSV pins. The binary signals bDQ[0] to bDQ[N-1] may be transmitted to a plurality of memory dies through the TSVs TSV1 to TSVn.

According to an example embodiment, the receiving circuit 400 may output the multilevel signals sDQ[0] to sDQ[K-1] to the TSVs TSV1 to TSVN through the TSV pins, without converting the multilevel signals sDQ[0] to sDQ[K-1] into the binary data. In this case, in an example embodiment, the receiving circuit 400 does not include the decoder 440.

Figure 7:
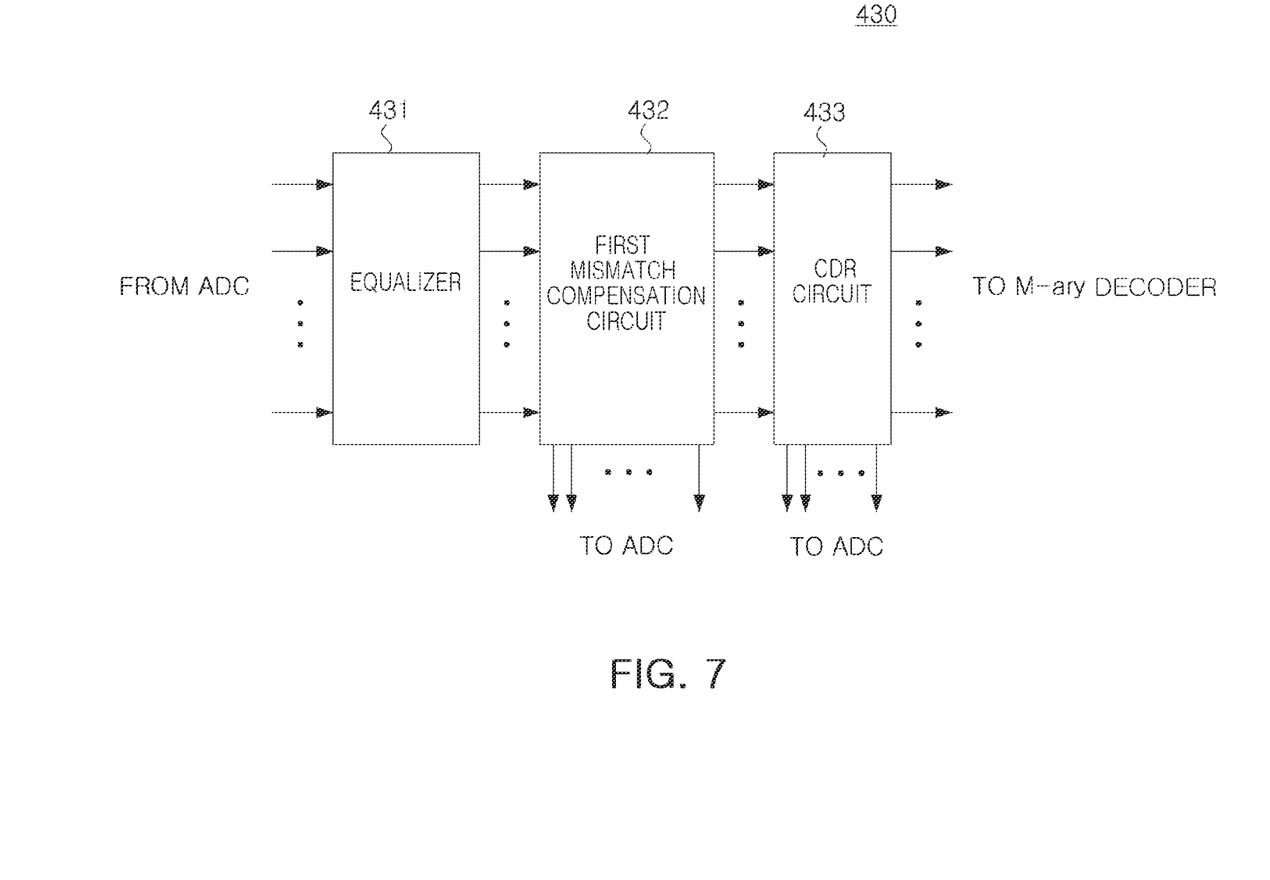
FIG. 7 illustrates a first compensation circuit according to an example embodiment.

FIG. 7 illustrates a first compensation circuit according to an example embodiment.

Referring to FIG. 7, the first compensation circuit 430 may include an equalizer 431, a first mismatch compensation circuit 432, and a clock and data recovery (CDR) circuit 433.

The equalizer 431 may restore a signal that is distorted in the process of transmitting the signal to the original shape thereof. The resistance component of the signal line and the input capacitance of the transmitting/receiving terminal may cause an ISI phenomenon in the data signal, and the equalizer 431 may remove the ISI phenomenon of the data signal.

The equalizer 431 may be implemented as an analog circuit or a digital circuit. For example, a continuous time linear equalizer (CTLE) may be implemented as an analog circuit, and a feed forward equalizer (FFE) may be implemented as a digital circuit. A decision feedback equalizer (DFE) may be implemented as an analog circuit or a digital circuit.

The first mismatch compensation circuit 432 may compensate for a timing skew mismatch between channels, an offset mismatch between channels, and a gain mismatch between the channels.

Gain mismatch and offset mismatch may be caused by differences in the semiconductor process distribution of ADCs. The gain mismatch may indicate that the gains of the amplifiers included in the ADCs are different from each other. The gain mismatch may cause differences in the amplitude of the signal. The offset mismatch may indicate that the offset voltages of the amplifiers included in the ADCs are different from each other. The offset mismatch may cause a difference in the average level of the signal.

The timing skew mismatch between channels may indicate that the physical lengths are different from each other between channels. The timing skew mismatch between channels may cause a difference in the time the signal arrives to the ADCs. Accordingly, timing skew mismatch between the channels may be compensated by compensating for timing skew between signals arriving to the ADCs.

The CDR circuit 433 may compensate for a sampling timing mismatch between channels. The CDR circuit 433 may be a circuit that restores data and a clock synchronized to the data, using a signal received from the first mismatch compensation circuit 432 and an internal clock signal. The CDR circuit 633 may output the clock synchronized to the data to the ADCs. The sampling period of the ADC may be adjusted based on the clock synchronized to the data.

According to an example embodiment, when a separate strobe signal such as a DQS signal is used in the memory, the function of the mismatch compensation circuit as described above may also be applied to the strobe signal.

Figure 8:
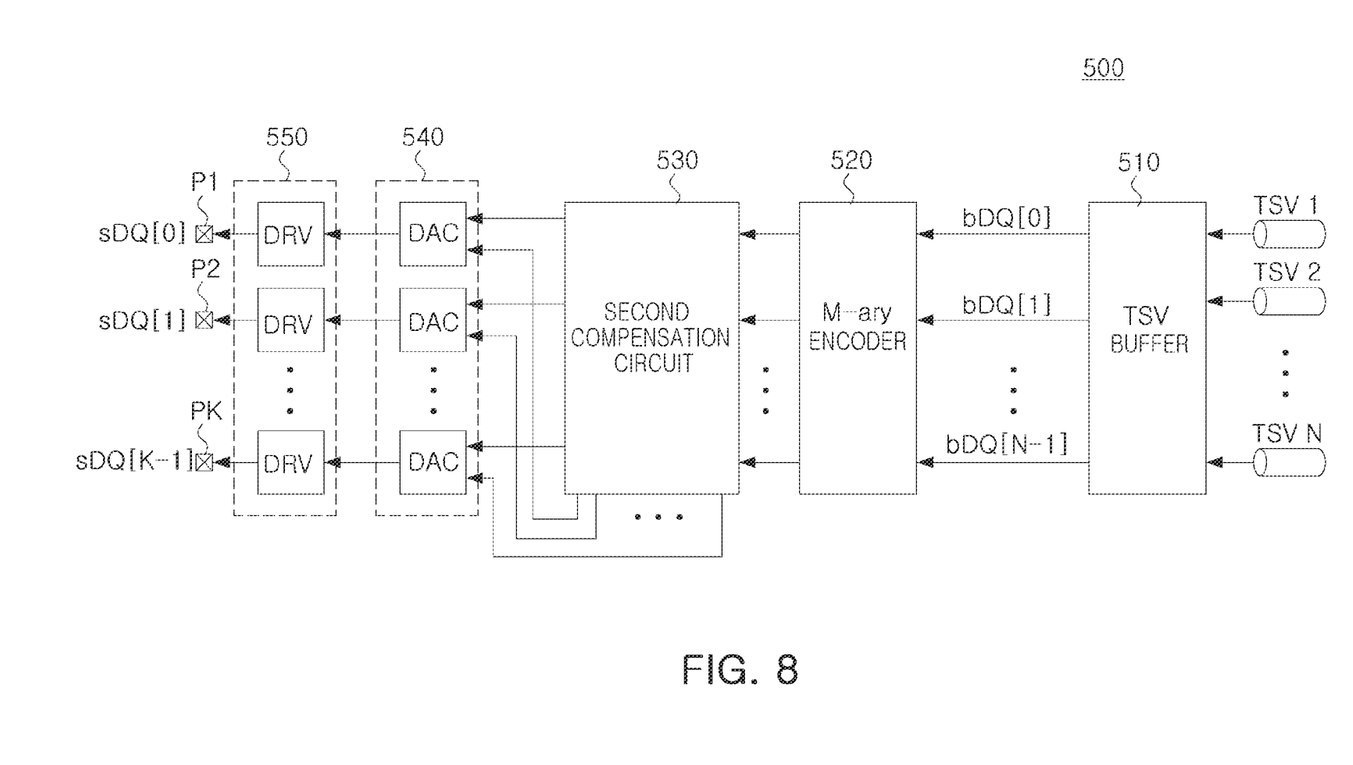
FIG. 8 illustrates a transmission circuit of a semiconductor device according to an example embodiment.

FIG. 8 illustrates a transmission circuit of a semiconductor device according to an example embodiment.

Referring to FIG. 8, a transmission circuit 500 may receive binary signals bDQ[0] to bDQ[N-1] from memory dies through N TSVs TSV1 to TSVN. The transmission circuit 500 may convert the binary signals bDQ[0] to bDQ[N-1] to multilevel signals sDQ[0] to sDQ[K-1] having M levels, and may output the multilevel signals sDQ[0] to sDQ[K-1] through K data pins P1 to PK. The components illustrated in FIG. 8 may be included in the first physical layer circuit PHY1 of the first semiconductor device 210.

The transmission circuit 500 may include a TSV buffer 510, an encoder 520, a second compensation circuit 530, a digital analog converter (DAC) 540, and a driver 550.

The TSV buffer 510 may receive the binary signals bDQ[0] to bDQ[N-1] from the memory dies through N TSVs TSV1 to TSVN, and may buffer the binary signals bDQ[0] to bDQ[N-1] and may output the buffered signals to the encoder 520.

The encoder 520 may convert the binary signals bDQ[0] to bDQ[N-1] into a multilevel signal having M levels.

The second compensation circuit 530 may receive the multilevel signal and perform digital signal processing. For example, the second compensation circuit 530 may compensate for distortion of channels through which data is to be transmitted, and may compensate for a timing skew mismatch between channels, an offset mismatch between channels, and a gain mismatch between channels. The second compensation circuit 530 will be described in detail with reference to FIG. 9.

The DAC 540 may include a plurality of DACs corresponding to a plurality of channels. The DAC 540 may convert a digital signal into an analog signal.

The driver 550 may include a plurality of drivers DRV and may transmit the binary signals sDQ[0] to sDQ[K−1] to channels of the package substrate through K data pins P1 to PK.

The data pins P1 to PK may be connected to bumps mounted on the package substrate.

According to an example embodiment, the transmission circuit 500 may transmit the multilevel signals sDQ[0] to sDQ[K−1] to channels of the package substrate through the data pins P1 to PK. In this case, in an example embodiment, the transmission circuit 500 does not include the encoder 520.

Figure 9:
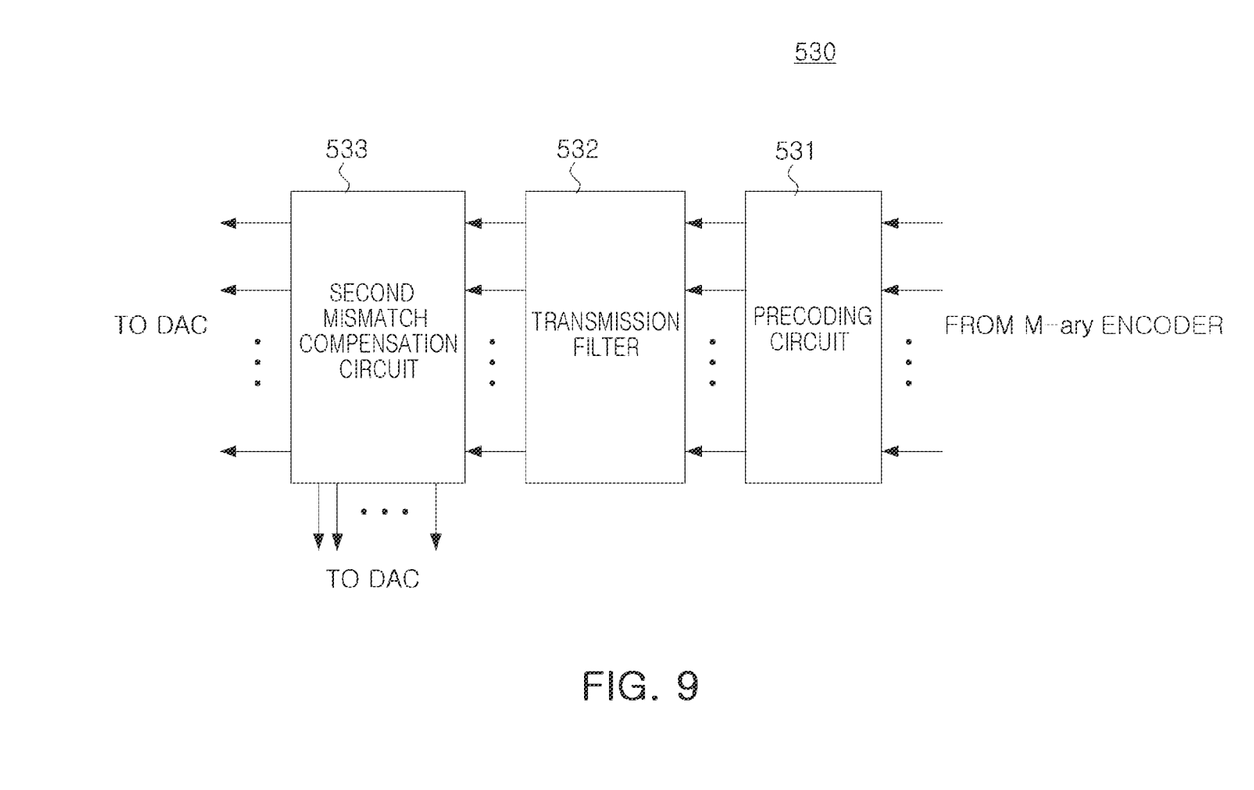
FIG. 9 illustrates a second compensation circuit according to an example embodiment.

FIG. 9 illustrates a second compensation circuit according to an example embodiment.

Referring to FIG. 9, the second compensation circuit 530 may include a precoding circuit 531, a transmission filter 532, and a second mismatch compensation circuit 533.

The precoding circuit 531 may code data using a precoding matrix. Precoding refers to changing a data pattern to another pattern by coding data to be transmitted using the precoding matrix. For example, when there are too many "1s", too many "0s", or too many "1" and "0" switching, in data, the precoding circuit 531 may change the data pattern to another pattern.

For example, a data encoding method such as Data Bus Inversion (DBI) may be used. DBI is an I/O signaling technique that reduces DC power consumption by selectively inverting the data bus for systems in which the power consumed between alternate signaling states is asymmetric. When the data bits are inverted, an additional signal referred to as a DBI bit indicating that the data bits are inverted may be set. By transmitting the pre-coded data, the reliability of data transmission may be increased.

The transmission filter 532 may compensate data in advance based on channel state information and may transmit the data. For example, the transmission filter 532 may be a finite impulse response (FIR) filter.

The second mismatch compensation circuit 533 may compensate for a timing skew mismatch between channels through which a data signal is to be transmitted, an offset mismatch between the channels, and a gain mismatch between the channels. The second mismatch compensation circuit 533 of the receiving circuit may operate on a similar principle to the first mismatch compensation circuit of the transmission circuit, except for some differences.

For example, in the case of a timing skew mismatch between channels, the first mismatch compensation circuit of the receiving circuit uniformly matches the timing skew that has already occurred between data signals, while the second mismatch compensation circuit 533 of the transmission circuit artificially applies a timing skew in advance such that the receiving circuit may receive data signals at the same time.

Figure 10:
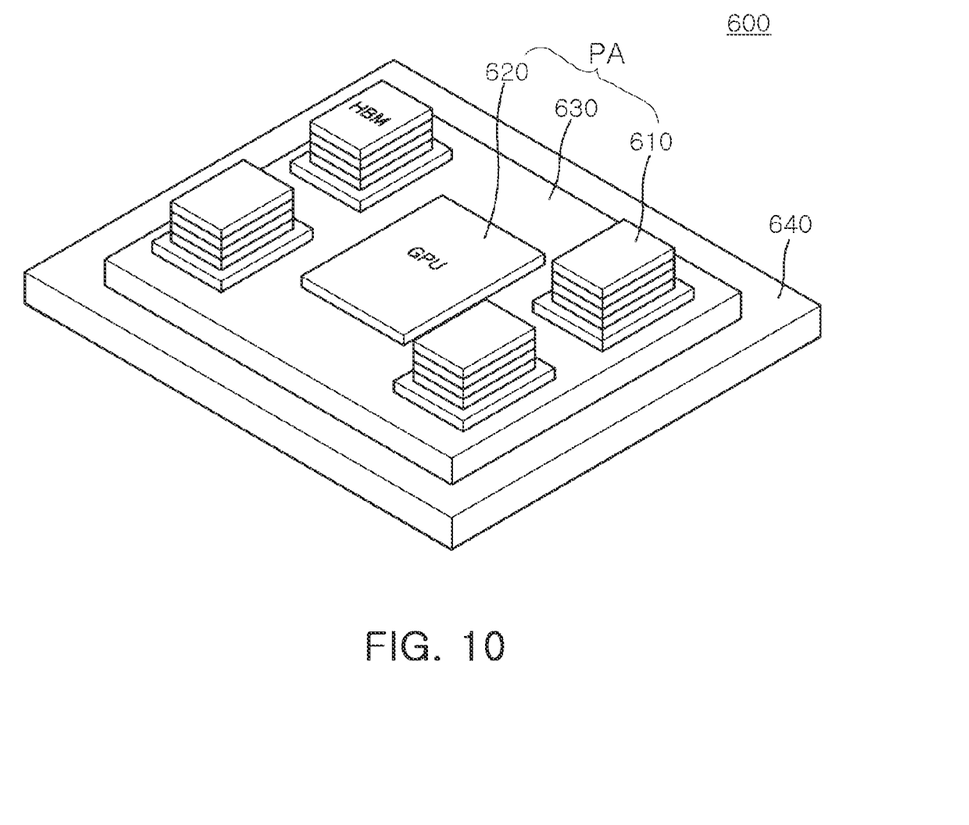
FIG. 10 illustrates a high-bandwidth memory system according to an example embodiment.

FIG. 10 illustrates a high-bandwidth memory system according to an example embodiment.

Referring to FIG. 10, a high-bandwidth memory system 600 may include a plurality of HBMs 610, a processor 620, a package substrate 630, and a motherboard 640. The plurality of HBMs 610 may correspond to the first semiconductor device described with reference to FIGS. 2 to 9.

The processor 620 may correspond to a CPU, a GPU, or the like. The plurality of HBMs 610, the processor 620, and the package substrate 630 may be provided as a single semiconductor package PA. The semiconductor package PA may be mounted on the motherboard 640 through an external connection terminal.

The plurality of HBMs 610 and the processor 620 may communicate with each other through channels provided by signal lines of the package substrate 630. For example, the plurality of HBMs 610 and the processor 620 may communicate using multilevel signaling, without an interposer. Accordingly, the manufacturing cost of the high-bandwidth memory system 600 may be lowered. Inferior SI environments that may occur when the signal lines of the package substrate 630 are used, and mismatch between different channels, may be prevented or reduced using a digital signal processing function. The digital signal processing function may be implemented in the buffer die of the HBMs 610.

As set forth above, according to an example embodiment, since a memory system includes a digital signal processing function, there is an effect of overcoming a poor signal integrity (SI) environment and a mismatch between different channels, that occurs when communication is performed through wiring formed on a package substrate without an interposer.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. A high bandwidth memory system, comprising:
   a motherboard; and
   a semiconductor package coupled to the motherboard,
   wherein the semiconductor package comprises:
      a package substrate mounted on the motherboard and comprising a plurality of signal lines providing a plurality of channels;
      a first semiconductor device mounted on the package substrate and comprising a first physical layer (PHY) circuit; and
      a second semiconductor device mounted on the package substrate and comprising a second PHY circuit,
   wherein
      the first semiconductor device and the second semiconductor device exchange a data signal with each other through the plurality of channels,
      the data signal is a multilevel signal having M levels, where M is a natural number greater than 2, and
      the first PHY circuit compensates for distortion of the channels and compensates for a mismatch between the channels by performing digital signal processing.

2. The high bandwidth memory system of claim 1, wherein the first semiconductor device comprises a buffer die and at least one memory die stacked on the package substrate,
   wherein the buffer die comprises the first PHY circuit.

3. The high bandwidth memory system of claim 2, wherein the first PHY circuit comprises:
   a plurality of analog-to-digital converters (ADCs) corresponding to the channels,
      wherein the ADCs convert the data signal received from the second semiconductor device into a digital signal;

a first compensation circuit that compensates for distortion of the channels and compensates for a mismatch between the channels; and
a decoder that converts the digital signal into a binary signal.

4. The high bandwidth memory system of claim 3, wherein the first compensation circuit comprises an equalizer that removes inter-symbol interference of the data signal.

5. The high bandwidth memory system of claim 3, wherein the first compensation circuit comprises a first mismatch compensation circuit that compensates for a timing skew mismatch between channels, an offset mismatch between the channels, and a gain mismatch between the channels.

6. The high bandwidth memory system of claim 3, wherein the first compensation circuit comprises a clock and data recovery (CDR) circuit that restores data and a clock synchronized to the data, using the digital signal and an internal clock signal.

7. The high bandwidth memory system of claim 6, wherein the CDR circuit outputs the clock synchronized to the data to the ADCs, and compensates for a sampling timing mismatch between the channels based on the clock synchronized to the data.

8. The high bandwidth memory system of claim 1, wherein the first PHY circuit comprises:
an encoder that converts a binary signal into the multilevel signal;
a compensation circuit that compensates for distortion of the channels through which the multilevel signal is to be transmitted, and compensates for a mismatch between the channels; and
a plurality of digital-to-analog converters (DACs) corresponding to the channels that convert the multilevel signal into an analog signal,
wherein the analog signal is transmitted to the second semiconductor device through the channels.

9. The high bandwidth memory system of claim 8, wherein the compensation circuit comprises a precoding circuit that pre-codes data and converts a data pattern into another pattern.

10. The high bandwidth memory system of claim 8, wherein the compensation circuit comprises a mismatch compensation circuit that compensates for a timing skew mismatch between the channels through which the multilevel signal is to be transmitted, an offset mismatch between the channels, and a gain mismatch between the channels.

11. A high bandwidth memory system, comprising:
a package substrate comprising a plurality of signal lines that provides a plurality of channels;
at least one first semiconductor device comprising a buffer die and a plurality of memory dies stacked on the buffer die;
a second semiconductor device that exchanges a data signal with the first semiconductor device through the plurality of channels; and
a plurality of connection terminals that directly connects the at least one first semiconductor device and the second semiconductor device to the package substrate,
wherein the data signal is a multilevel signal having M levels, where M is a natural number greater than 2, and the at least one first semiconductor device compensates for distortion of the channels and compensates for a mismatch between the channels.

12. The high bandwidth memory system of claim 11, wherein the buffer die comprises:

a plurality of analog-to-digital converters (ADCs) corresponding to the channels that converts the data signal received from the second semiconductor device into a digital signal;
a first compensation circuit that compensates for distortion of the channels and compensates for a mismatch between the channels; and
a decoder that decodes the digital signal into a binary signal,
wherein the binary signal is transmitted to the memory dies.

13. The high bandwidth memory system of claim 12, wherein the first compensation circuit comprises an equalizer that removes inter-symbol interference of the data signal.

14. The high bandwidth memory system of claim 12, wherein the first compensation circuit comprises a first mismatch compensation circuit that compensates a timing skew mismatch between the channels, an offset mismatch between the channels, and a gain mismatch between the channels.

15. The high bandwidth memory system of claim 12, wherein the first compensation circuit comprises a clock and data recovery (CDR) circuit that restores data and a clock synchronized to the data, using the digital signal and an internal clock signal.

16. The high bandwidth memory system of claim 15, wherein the CDR circuit outputs the clock synchronized to the data to the ADCs, and compensates for a sampling timing mismatch between the channels based on the clock synchronized to the data.

17. The high bandwidth memory system of claim 11, wherein the buffer die comprises:
an encoder that converts a binary signal received from the memory dies into the multilevel signal;
a compensation circuit that compensates for distortion of the channels through which the multilevel signal is to be transmitted, and compensates for a mismatch between the channels; and
a plurality of digital-to-analog converters (DACs) corresponding to the channels that converts the multilevel signal into an analog signal,
wherein the analog signal is transmitted to the second semiconductor device through the channels.

18. A high bandwidth memory system, comprising:
a buffer die comprising a transmission circuit and a receiving circuit that exchange a data signal with a processor through a plurality of channels of a package substrate; and
a plurality of memory dies stacked on the buffer die and connected to the buffer die through a plurality of through-electrodes,
wherein the receiving circuit of the buffer die comprises:
a plurality of analog-to-digital converters (ADCs) corresponding to the channels that converts a multilevel signal having M levels, where M is a natural number greater than 2, received through the channels, into a digital signal;
a first compensation circuit that compensates for distortion of the channels and compensates for a mismatch between the channels;
a decoder that converts the digital signal into a binary signal; and
a driver that outputs the binary signal to the plurality of through-electrodes.

19. The high bandwidth memory system of claim 18, wherein the first compensation circuit comprises:

an equalizer that removes inter-symbol interference of the data signal;

a first mismatch compensation circuit that compensates for a timing skew mismatch between the channels, an offset mismatch between the channels, and a gain mismatch between the channels; and a clock and data recovery (CDR) circuit that restores data and a clock synchronized to the data, using the digital signal and an internal clock signal, wherein the CDR circuit outputs the clock synchronized to the data to the ADCs, and compensates for a sampling timing mismatch between the channels based on the clock synchronized to the data.

20. The high bandwidth memory system of claim 18, wherein the transmission circuit of the buffer die comprises:

an encoder that converts the binary signal received from the memory dies into the multilevel signal;

a second compensation circuit that compensates for distortion of the channels to which the multilevel signal is to be transmitted, and that compensates for a mismatch between the channels; and a plurality of digital-to-analog converters (DACs) corresponding to the channels and that converts the multilevel signal into an analog signal, wherein the analog signal is transmitted to the processor through the channels.

* * * * *